United States Patent [19]

Macovski

[11] Patent Number: 4,851,777
[45] Date of Patent: Jul. 25, 1989

[54] REDUCED NOISE NMR LOCALIZATION SYSTEM

[75] Inventor: Albert Macovski, Menlo Park, Calif.

[73] Assignee: Stanford University, Stanford, Calif.

[21] Appl. No.: 180,180

[22] Filed: Apr. 11, 1988

Related U.S. Application Data

[63] Continuation of Ser. No. 853,861, Apr. 21, 1986, abandoned.

[51] Int. Cl.$^4$ .................................................. G01R 33/20
[52] U.S. Cl. ...................................... 324/309; 324/307
[58] Field of Search .............. 324/300, 307, 309, 312, 324/310, 317, 318

[56] References Cited

U.S. PATENT DOCUMENTS 4,685,468  8/1987  Macovski ............................ 324/309

4,703,272 10/1987  Arakawa ............................ 324/318

FOREIGN PATENT DOCUMENTS 0155978  2/1985  European Pat. Off. ............ 324/307
58107444  5/1985  Japan ................................. 324/300
58202441  5/1985  Japan ................................. 324/307

*Primary Examiner*—Stewart J. Levy
*Assistant Examiner*—Louis M. Arana
*Attorney, Agent, or Firm*—Flehr, Hohbach, Test, Albritton & Herbert

[57] ABSTRACT

Magnetic resonance signals are received using a plurality of coils, each sensitive to different but overlapping regions of the volume being studied. The signals are combined so as to cancel in undesired regions of the body and receive net signals from only desired parts of the volume to enhance the signal-to-noise ratio for imaging and spectroscopy.

15 Claims, 2 Drawing Sheets

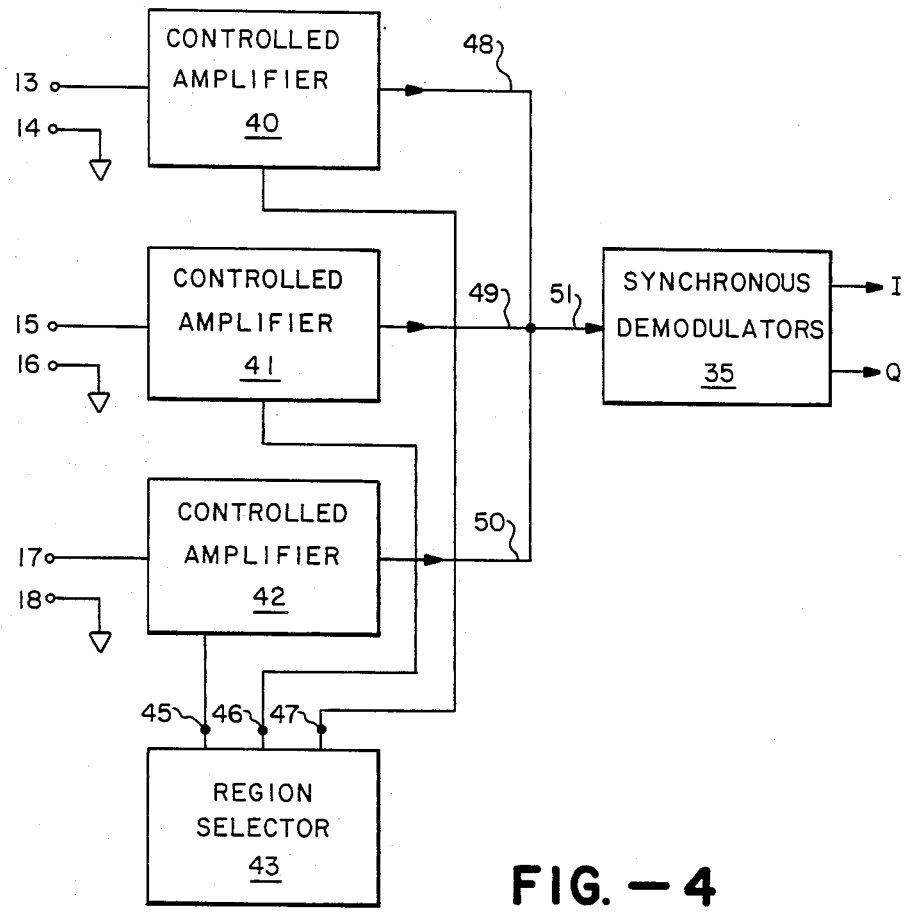
FIG. —4
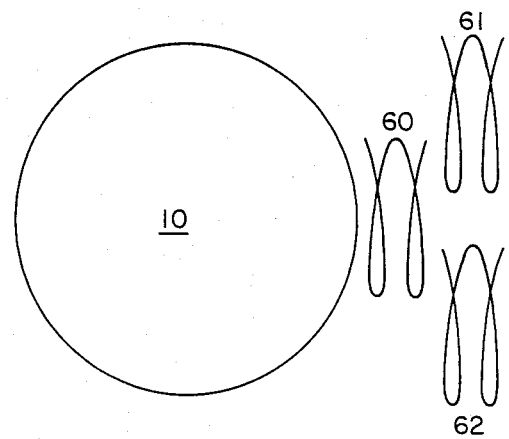
FIG. —5

REDUCED NOISE NMR LOCALIZATION SYSTEM

This is a continuation of application Ser. No. 853,861 filed Apr. 21, 1986, now abandoned.

BACKGROUND OF THE INVENTION

1. Field of the Invention

This invention relates to imaging systems and spectroscopic systems using nuclear magnetic resonance. In a primary application the invention relates to deriving NMR information from regions of the body with improved signal-to-noise ratio.

2. Descripton of Prior Art

In magnetic resonance imaging system, as presently practiced, the dominant noise source is the body losses, far exceeding both the coil losses and the first amplifier noise. As a result, to improve the SNR, surface coils have been designed which couple to only a portion of the body, to reduce the resultant noise. These are described in a book entitled Nuclear Magnetic Resonance and Its Applications to Living Systems, by D. G. Gadian, Clarendon Press, Oxford, 1982. Unfortunately, these coils provide improved performance for only superficial parts of the body, close to the surface. Also, it is difficult to control the shape of the sensitive volume which is essentially prescribed by the diameter of the coil as described in a paper by C. E. Hayes and L. Axel entitled, "Noise Performance of Surface Coils for Magnetic Resonance Imaging at 1.5T," Medical Physics, 12:604–607, Sept. 1985. As a result, if it is desired to view an interior region with high SNR, or perform localized spectroscopy on an interior region, no method is presently available.

In the 1985 Preceedings of the Society of Magnetic Resonance in Medicine, London, two papers were presented which showed surface coils using pairs of coupled coils in several configurations. Although these configurations showed some desirable properties they still concentrated on superficial structures. In each case the maximum sensitivity was exhibited at the surface of the body, with the sensitivity monotonically decreasing in deeper regions. Thus deeper lying regions are received with relatively poor SNR since these coils are also deriving noise signals from a region near the surface. These combination of coils were not structured to cancel undesired regions.

SUMMARY OF THE INVENTION

An object of this invention is to provide magnetic resonance imaging and spectroscopic signals with improved SNR.

A further object of this invention is an improved system of surface coils which can have a region of sensitivity which is primarily restricted to the desired region of interest.

A further object of this invention is to provide a system of surface coils and associated control amplifiers having a controllable sensitive region.

A further object of this invention is to provide a system of surface coils which will be sensitive primarily to an interior region of the body with negligible sensitivity to other regions.

Briefly, in accordance with the invention, an array of coils are used which are separated so as to have different but overlapping sensitive regions. The signals from these coils are weighted and combined to provide maximum sensitivity at the region of interest and reduced sensitivity elsewhere. The combining and weighting can be achieved by directly connecting the coils, or by amplifying each signal and combining the amplified outputs. In the latter case the amplifier gains or weights can be controlled, so as to control the region of sensitivity.

BRIEF DESCRIPTION OF THE DRAWINGS

For a more complete disclosure of the ivention, reference may be made to the following detailed description of several illustrative embodiments thereof which is given in conjunction with the accompanying drawings, of which:

FIG. 4 is a schematic representation of an embodiment of the invention using controlled amplifiers; and FIG. 5 is a schematic representation of an alternate embodiment of the invention.

DESCRIPTION OF THE PREFERRED EMBODIMENT

Figure 1:
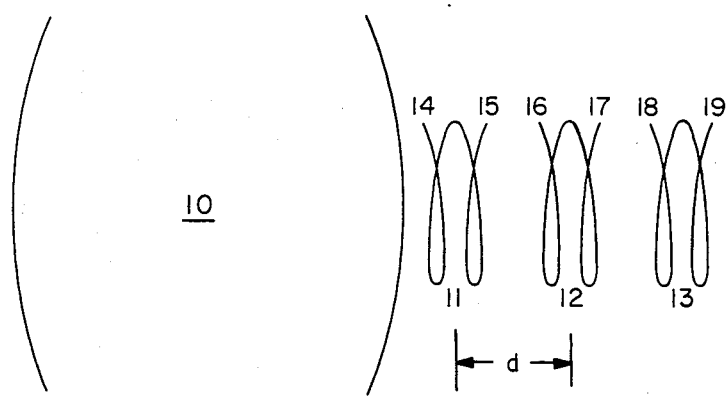
FIG. 1 is a schematic representation of an embodiment of the invention.

FIG. 1 illustrates the basic block diagram of an embodiment of the invention. Here an array of surface coils, 11, 12, 13, are each spaced at different distances from object 10, generally the human body. The signals from these coils are combined, as will be shown, to create a sensitive region within object 10. As previously indicated, the volume of the sensitive region primarily determines the amount of noise, since the body losses are the principal noise source. Therefore it is desirable that this region encompass the region being studied. Existing surface coils exhibit this maximum sensitivity near the surface, with decreasing sensitivity for interior regions. They therefore provide relatively poor SNR for interior regions, either for imaging, spectroscopy or chemical-shift imaging.

It must be emphasized that this localization of the sensitive region is essentially unrelated to the NMR localization procedures using a variety of gradient configurations. These procedures isolate signals from the parts of volume 10 of interest. However, they have no effect on the noise pickup, which is basically determined by the combined field effects of each coil.

To receive interior regions with good SNR, the coil outputs are combined in a manner so as to cancel undesired regions. It is important to realize that this cancellation applies to the noise signals since the same noise signals are picked up in coupled coils.

Figure 2:
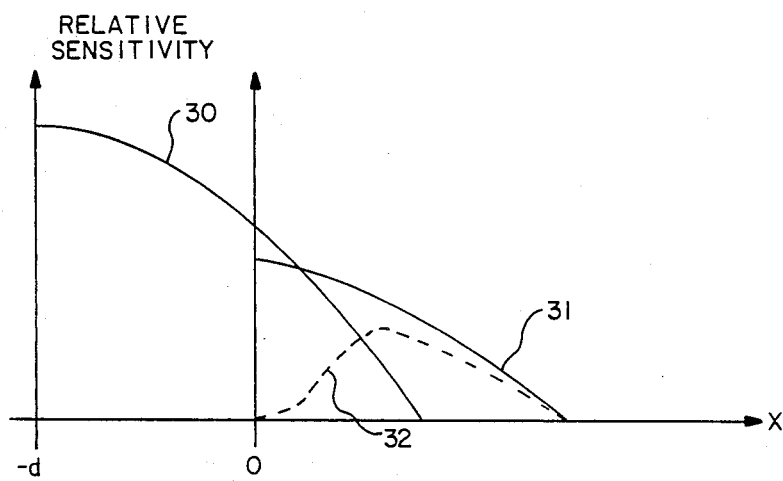
FIG. 2 is a set of curves illustrating the operation of an embodiment of the invention.

As a simple illustration, assume we are using solely coils 11 and 12 and that their outputs are combined in a bucking or cancelling relationship. Assume that coil 12 is separated by a distance d from coil 11 and has approximately twice as many turns. The individual sensitivity curves are shown in FIG. 2 with the curve the coil 11 shown as 31 and the curve for coil 12 shown as 30. Since the outputs are subtracted, the resultant sensitivity curve is shown as the dashed line 32. Note that the maximum sensitivity occurs at some desired interior region, with cancellation occurring near the surface of the body. Only the integrated region under curve 32 will contribute to the noise, thus excluding the noise in the vincinity of the surface.

Figure 3:
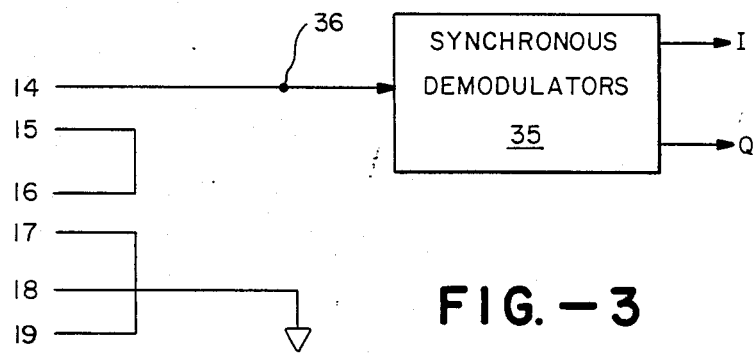
FIG. 3 is a schematic representation of an embodiment of the invention using series-connected coils.

FIG. 3 illustrates a more general approach to combining the coil signals. Here the outputs of the three coils are combined, either in adding or opposing polarity, to provide the desired sensitive region. In addition, the number of turns on the coils determines the relative weights of each component, as illustrated in FIG. 2. The sum of the coil signals 36 becomes the classic NMR received signal as is currently practiced. It is applied to synchronous demodulators 35, usually consisting of product detectors driven by the cosine and sine of the carrier frequency. The demodulated outputs are termed I and Q referring to the in phase and quadrature components.

A more flexible arrangement is illustrated in FIG. 4. Here the output of each coil is applied to controlled amplifiers 40, 41 and 42 respectively. These amplifiers can be controlled to have positive or negative gain. They are controlled by control signals 45, 46 dn 47 respectively. These control signals determine the region to be selected. Region selector 43 can be manually or automatically programmed to select the region of interest for maximum SNR.

The procedures for choosing the optimum weights are well-known in control theory. Assume the desired region of interest is designated by f(x). Also, assume that each coil generates a sensitivity curve s(x). The resultant overall sensitivity curve g(x) is given by $$g(x) = a_0 s(x) + a_1 s(x-x_1) + a_2 s(x-x_2) + \ldots a_n s(x-x_n)$$

where the $a_0 \ldots a_n$ are the weights applied to each coil signal and the $x_1 \ldots x_n$ are the spacings of the coil. In general these are chosen to minimize the magnitude or square of g(x)−f(x), a well-known procedure. In the case of the system of FIG. 3 the weights $a_0 \ldots a_n$ represent the number of turns on the coil.

In the system of FIG. 1 the selective region was obtained in one dimension, normal to the plane of the coils. A variety of coil configurations can be used, however, within the theme of this invention. For example, instead of placing coils on one side of the body only, as in FIG. 1, coils can be placed on both sides of the body, making the choice of sensitive regions more flexible. Also, as shown in FIG. 5, the axes of coils can be displaced to provide spatial selectivity normal to the axes of the coils. Here coils 60, 61, and 62 have displaced axes. Their outputs can be combined to appropriately select the sensitive region.

In the system of FIG. 4, especially where high frequencies are used, the various cancellations can be inexact due to the various phase shifts throughout the system. To correct this compensating phase shifters can be placed in the amplifier chains to correct the phase errors. These can also be placed in the system of FIG. 3. These phase shifters can also be used as part of the spatial selectivity mechanism.

In general, for maximum efficiency, resonant coils are used for surface coils. Thus in FIGS. 1, 3, 4, and 5, the coils can be resonated to the resonant frequency of the systems, usually referred to as the Larmor frequency. This frequency is proportional to the magnetic field. Alternatively, the system of FIG. 3, having a series connected set of coupled coils, can be a single resonant system. The combination of self inductances, plus adding and subtracting mutual inductances, can be used to form a resonant circuit at the Larmor frequency.

In general the system is designed to provide improved SNR when receiving magnetic resonance signals. However, the system of FIG. 3 can also be used in the transmit mode. A transmit-receive switch can be placed at signal 36. In the transmit mode the transmit burst is sent into the series array of coils to provide a spatially selective excitation in the region of interest.

For many imaging and spectroscopic applications the gradient system is used to sequence through various regions of the body. For example, in projection imaging, the projection of a volume can be obtained by sequencing through a series of parallel planes, each time taking the projection of each plane. To maximize the associated SNR, the system of FIG. 4 can be used to limit the sensitive volume to the region of each plane, while the plane is being acquired. This approach can also be used for multi-plane cross-sectional imaging.

When the system is structured to receive signals from a relatively small volume, the noise from the coil losses can become comparable to or greater than the body losses. In that case the SNR can be further improved by supercooling the array of receiver coils. This can be accomplished using the same cooling system as is used for the main magnet.

What is claimed is:

1. In a method for isolating nuclear magnetic resonance signals from a limited region in a volume the steps of receiving signals from a plurality of coils where all coils receive signals from different but overlapping portions of the volume including said limited region, weighting said received signals whereby signals from outside of said limited region can be suppressed and signals from said limited region can be enhanced, and combining the weighted signals to provide an increased signal-to-noise ratio nuclear magnetic resonance signal from said limited region of interest including adding weighted signals from said limited region and subtracting weighted signals from outside of said limited region of interest.

2. In a method for isolating nuclear magnetic resonance signals from a limited region in a volume the steps of receiving signals from a plurality of coils where all coils receive signals from different but overlapping portions of the volume, weighting said received signals to isolate a limited region of interest in said volume, and combining the received signals to provide an increased signal-to-noise ratio nuclear magnetic resonance signal from said limited region of interest, including the step of subtracting at least one of the received signals from at least one other received signal.

3. The method as defined by claim 2 wherein said signals are weighted prior to the step of combining said signals.

4. The method as defined by claim 3 wherein said signals are weighted by the number of turns in each of said plurality of coils.

5. The method as described in claim 4 where the step of combining includes the step of connecting the coils together.

6. The method as described in claim 3 where the step of combining includes the step of applying the output of each coil to an amplifier and combining the outputs of the amplifiers.

7. The method as described in claim 1 where the step of combining includes the step of sequentially combining combinations of different coils whereby a region of the volume is imaged with high signal-to-noise ratio.

8. Apparatus for isolating nuclear magnetic signals from a limited region in a volume comprising:
a plurality of coils positioned adjacent the volume to receive signals from different but overlapping portions of the volume including said limited region,
means for receiving and weighting signals from each coil including said limited region; and
means for combining the weighted signals to provide high sensitivity in said limited region and low sensitivity outside of said limited region whereby the signal-to-noise ratio in the desired portion is increased, said means for combining adding weighted signals from said limited region and subtracting weighted signals from outside of said limited region of interest.

9. Apparatus as described in claim 8 where the means for combining includes means for subtracting at least one received signal from at least one other received signal.

10. Apparatus for isolating nuclear magnetic signals from a limited region in a volume comprising:
a plurality of coils positioned adjacent the volume;
means for receiving signals from each coil;
means for weighting said signals, and
means for combining the received signals and including means for subtracting at least one received signal from at least one other received signal.

11. Apparatus as defined in claim 10 wherein said plurality of coils have selected numbers of turns for weighting said signals.

12. Apparatus as described in claim 11 where the means for combining includes means for connecting the coils together.

13. Apparatus as described in claim 11 where the means for combining includes means for applying the output of each coil to an amplifier and combining the outputs of the amplifiers.

14. Apparatus as described in claim 13 where the amplifiers have controlled gain.

15. Apparatus for isolating nuclear magnetic signals from a limited region in a volume comprising:
a plurality of coils positioned adjacent the volume;
means for receiving and weighting signals from each coil; and
means for combining the weighted signals including means for sequentially adding and subtracting combinations of weighted signals from different coils thereby providing high sensitivity in said limited region of the volume and increasing the signal-to-noise ratio in said limited region.

* * * * *